(12) United States Patent
Kariya et al.

(10) Patent No.: US 7,751,205 B2
(45) Date of Patent: Jul. 6, 2010

(54) PACKAGE BOARD INTEGRATED WITH POWER SUPPLY

(75) Inventors: Takashi Kariya, Ibi-gun (JP); Yasuhiko Mano, Ibi-gun (JP); Shuichi Kawano, Ibi-gun (JP); Liyi Chen, Ibi-gun (JP)

(73) Assignee: IBIDEN Co., Ltd., Ogaki-shi (JP)

( * ) Notice: Subject to any disclaimer, the term of this patent is extended or adjusted under 35 U.S.C. 154(b) by 787 days.

(21) Appl. No.: 11/482,793

(22) Filed: Jul. 10, 2006

(65) Prior Publication Data

US 2008/0007925 A1    Jan. 10, 2008

(51) Int. Cl.
*H05K 7/00* (2006.01)

(52) U.S. Cl. .................. 361/821; 361/761; 361/763; 361/782; 361/807

(58) Field of Classification Search ............. 361/728, 361/734, 736, 738, 748, 760, 761, 763, 766, 361/782, 783, 790, 792, 821, 301.1, 301.2, 361/302, 303, 306, 306.2, 307, 271, 679.01, 361/270, 814, 807; 174/260, 264, 265, 250, 174/262; 336/200
See application file for complete search history.

(56) References Cited

U.S. PATENT DOCUMENTS

| | | | |
|---|---|---|---|
| 6,611,419 B1 * | 8/2003 | Chakravorty | 361/306.3 |
| 2002/0017399 A1 * | 2/2002 | Chang et al. | 174/262 |
| 2002/0039667 A1 * | 4/2002 | Takaya et al. | 428/692 |
| 2003/0086248 A1 * | 5/2003 | Mashino | 361/767 |
| 2006/0137905 A1 * | 6/2006 | Kariya et al. | 174/255 |
| 2006/0145804 A1 * | 7/2006 | Matsutani et al. | 336/200 |

(Continued)

FOREIGN PATENT DOCUMENTS

JP    7-201610    8/1995

(Continued)

OTHER PUBLICATIONS

U.S. Appl. No. 11/429,157, filed May 8, 2006, Mano, et al.

*Primary Examiner*—Dameon E Levi
*Assistant Examiner*—Hoa C Nguyen
(74) *Attorney, Agent, or Firm*—Oblon, Spivak, McClelland, Maier & Neustadt, L.L.P.

(57) ABSTRACT

This invention provides a small package board integrated with power supply capable of supplying a low level of voltage and high level of current to an IC while achieving a low height of its power supply. It becomes hard to saturate an inductor magnetically when the surface of a copper wire is coated with a magnetic layer, and the inductor can accordingly be provided with a sufficient degree of inductance. A multiplicity of inductors can be provided within a confined space by arranging a multiplicity of inductors in parallel, and by fixing them with resin so as to form an inductor array, thereby making it possible to divide a power supply. The number of power supply lines is increased by dividing the power supply so as to reduce the level of current in an individual power supply line, so that a high level of current can be supplied to an IC chip. Further, a distance between a power supply and the IC chip can be decreased by incorporating a power supply module into the package board so as to reduce generation of heat and curb a drop in voltage in the power supply line, thereby making it possible to supply a high level of current to the IC chip.

17 Claims, 11 Drawing Sheets

U.S. PATENT DOCUMENTS

| | | | |
|---|---|---|---|
| 2006/0170527 A1* | 8/2006 | Braunisch | 336/223 |
| 2007/0010702 A1* | 1/2007 | Wang et al. | 600/8 |
| 2007/0257761 A1* | 11/2007 | Mano et al. | 336/200 |
| 2008/0245555 A1* | 10/2008 | Li et al. | 174/262 |

FOREIGN PATENT DOCUMENTS

| | | |
|---|---|---|
| JP | 7-263241 | 10/1995 |
| JP | 10-233469 | 9/1998 |

\* cited by examiner

Fig. 4
(A)
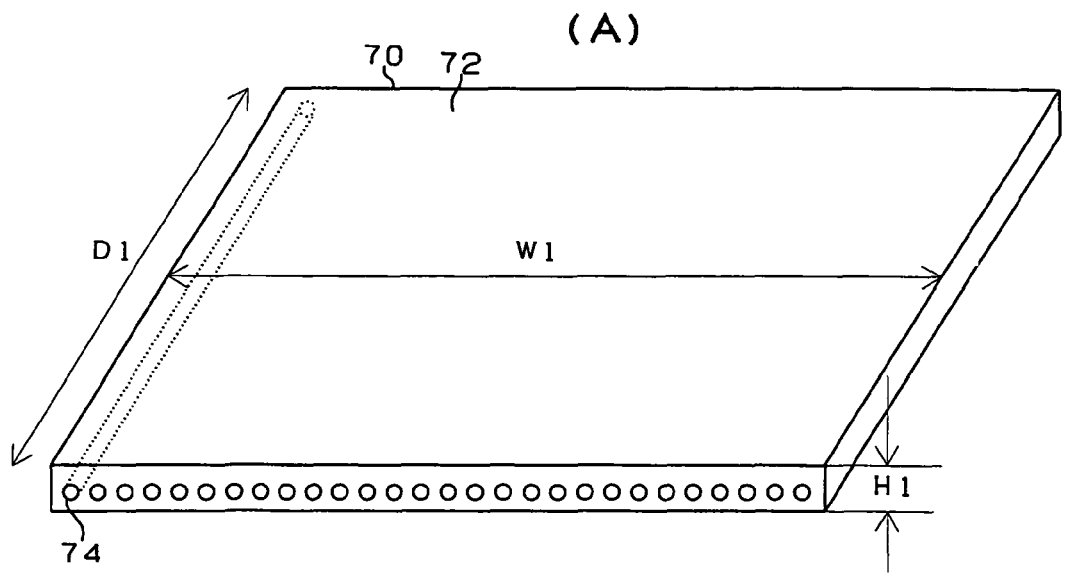
(B)
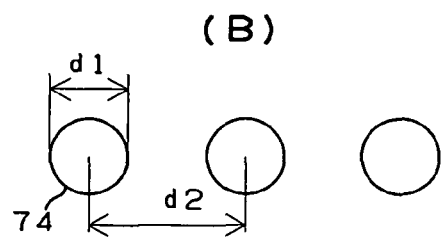
(C)
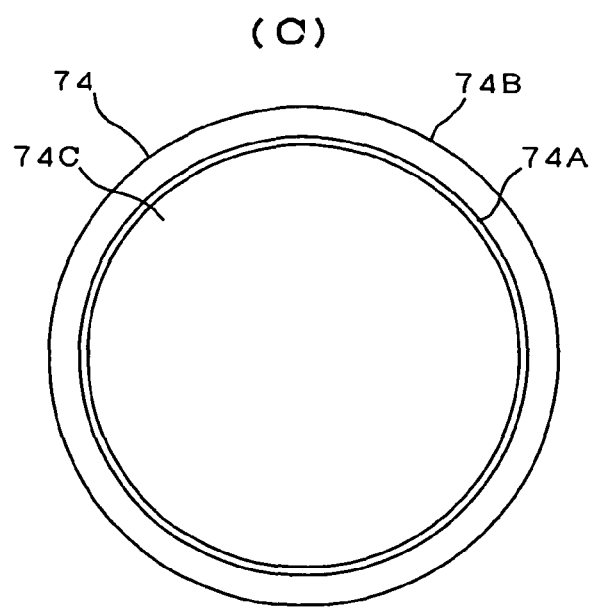

Fig. 7
(A)
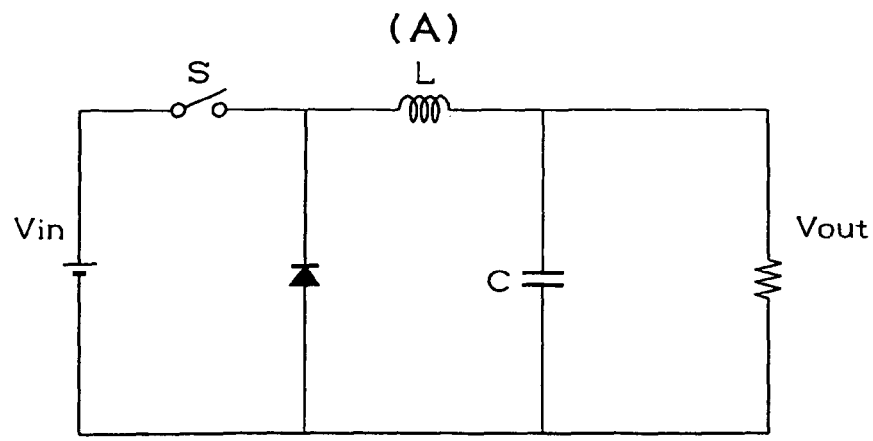
(B)
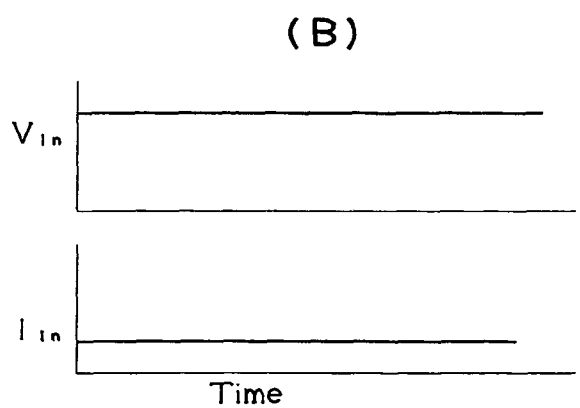
(C)
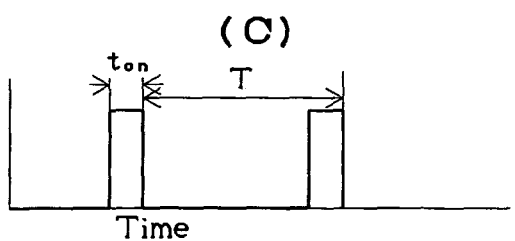
(D)
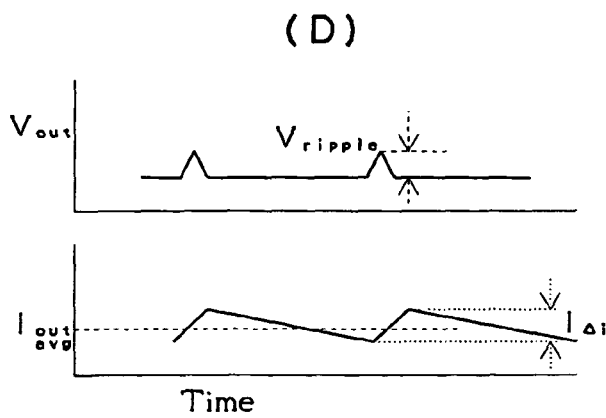

PACKAGE BOARD INTEGRATED WITH POWER SUPPLY

BACKGROUND OF THE INVENTION

1. Field of the Invention

The present invention relates to a package board loaded with an integrated circuit (IC), and more particularly to a package board integrated with power supply for supplying electricity to the IC.

2. Description of the Related Art

Large-scale integrated circuits (LSIs) have been designed so as to reduce a drive voltage in order to achieve at one and the same time acceleration of velocity and lower consumption of electricity, and in recent years the drive voltage has dropped to near 1 V. To supply electricity to a LSI, the voltage of a power supply needs to be reduced before being supplied. A DC-DC converter using a switching device that ensures a high conversion efficiency is used, and a pulsating flow in the output of the switching device needs to be suppressed with a smoothing filter. This smoothing filter is constituted mainly of an inductor and a capacitor, and generally mounted on the surface as a discrete device. However, its mounting area can be expanded by mounting the inductor and capacitor in such a way that the mounting height is raised.

Prior Art 1 discloses a semiconductor device in which a board is provided with a noise-removing function. Prior Art 2 and Prior Art 3 disclose the structure of an inductance device. Prior Art 1: JP 10-233469 A is incorporated herein by reference. Prior Art 2: JP 7-201610 A is incorporated herein by reference. Prior Art 3: JP 7-263241 A is incorporated herein by reference.

With intensified performances and a lowering in the consumption of electricity in recent years, the drive voltage in a large scale integrated circuit device like a micro processing unit (MPU) has dropped to near 1 V so that, correspondingly, a current value has tended to rise significantly. On the other hand, fluctuations in voltage originating from components that are parasitic on wiring within a large scale integrated circuit produced for power supply and load becomes equal to a threshold voltage for driving a device in the large scale integrated circuit device. Occasions can thus occur when the large scale integrated, circuit malfunctions.

As a measure to counter fluctuations in voltage of power supply, demands have been made for the distance between the power supply and a load to be reduced as much as possible, and for this purpose it has been recognized that a very effective means to reduce the distance between the power supply and a load is to reduce the volume of the power supply itself as far as possible, so as to integrate the power supply with the package of the large scale integrated circuit device. However, it has become evident that a variety of problems can occur as a result of this. To cope with such problems, both the size and the height of the device within the power supply need to be reduced as much as possible, and, in particular, inductance has been a big factor in inhibiting reductions in the distance between the power supply and the load because it has tended to widen in order to meet with a situation that stems from a low level of voltage and a high level of current.

SUMMARY OF THE INVENTION

Accordingly, the present invention has been achieved to solve the above problems, and an object of the invention is to provide a package board integrated with a power supply which while suppressing fluctuations in voltage can supply a low voltage and a large current to an IC and which at the same time can achieve a low height of power supply.

To achieve the above object, the power supply needs to be provided integrally on the package board, and the power supply needs to be reduced in size to between $\frac{1}{10}$ and $\frac{1}{50}$. According to a first aspect of the invention, a package board is provided that is integrated with the power supply and incorporates an inductor array in which a plurality of inductors is arranged in parallel, and fixed with resin, each of the inductors being produced by coating a conductor wire with a magnetic layer.

According to a second aspect of the invention, a package board is provided that is integrated with the power supply and that comprises: an IC; a power supply for supplying electricity to the IC, the power supply containing a switching device, a control IC and a filter constituted of an inductor and capacitor for smoothing an output of the switching device; and an inductor array in which a plurality of inductors is arranged in parallel, and fixed with resin, each of the inductors being produced by coating a conductor wire with a magnetic layer. Consequently, a small level of power supply can be achieved by provision of such a small, low inductor array.

With a package board integrated with power supply of the first aspect it becomes difficult to saturate the package board magnetically in the course of applying a magnetic layer to the surface of the conductor wire and it is consequently possible to supply the inductor with sufficient inductance. A lot of inductors can be provided within a confined space by arranging a multiplicity of inductors in parallel, and by fixing them with resin, thereby making it possible to divide the power supply. The conductor sectional area of the power supply line can be increased by dividing the power supply so as to decrease the amount of current in an individual power supply line. As a consequence, generation of heat, and a drop in voltage in the power supply line, can both be reduced, thereby making it possible to supply a high level of the current to the IC.

With a package board integrated with power supply of the second aspect it becomes difficult to saturate the package board magnetically in the course of applying a magnetic layer to the surface of the conductor wire, and it is consequently possible to supply the inductor with sufficient inductance. A lot of inductors can be provided within a confined space by arranging a multiplicity of inductors in parallel, and by fixing them with resin, thereby making it possible to divide the power supply. The conductor sectional area of the power supply line can be increased by dividing the power supply so as to decrease the amount of current in an individual power supply line. As a consequence, a high level of current can be supplied to the IC. Further, the distance between the power supply and the IC can be decreased by incorporating the power supply in the package board, thereby reducing both generation of heat and the drop in voltage in the power supply line, and thus facilitating supply to the IC of a high level of current.

The package board integrated with power supply of the third aspect is constituted of switching devices and filters of a number obtained by dividing a level of current required by an allowable current value. From the viewpoint that a large level of current required can be supplied to the IC (load) in the course of suppressing the current value to less than the allowable current value of the power supply line. The quantity of switching devices and filters should preferably be respectively two and 100.

In the package board integrated with power supply of the fourth aspect of the invention, the capacitor is composed of electrode layers sandwiching a dielectric body provided in a side wall of a through hole formed in the package board. Thus, because the capacitor does not need to be provided on another body, the level of power supply can be reduced further and disposed in the vicinity of the IC, so as to reduce both the generation of heat and the drop in voltage, thereby making it possible to supply a high level of current to the IC.

In the package board integrated with power supply of the fifth aspect of the invention, the inductor array is disposed just below a load IC via the package board, in other words in the vicinity of the IC. Consequently, the length of the power supply line can be shortened, so that both generation of heat and a drop in voltage in the power supply line can also be reduced, thereby making it possible to supply a high level of current to the IC.

In the package board integrated with power supply of the sixth aspect of the invention, the magnetic layer is formed by performing wet electric plating. Consequently, it becomes difficult to saturate the inductor magnetically, so that the various inductors that constitute the inductor array can be supplied with a sufficient degree of inductance.

Because in the package board integrated with power supply of the seventh aspect of the invention, the magnetic layer is a magnetic body composed mainly of two or more of iron, cobalt and nickel, it becomes difficult to saturate the inductor magnetically, so that when they are powered, the various inductors that constitute the inductor array can be supplied with a sufficient degree of inductance.

Because in the package board integrated with power supply of the eighth aspect of the invention, resin used in molding the inductor contains a magnetic material, cross-talk between the inductors is suppressed, and overlapping of noise, thus prevented.

Furthermore, although a material which forms the package board may be any one of inorganic materials such as pyrex glass, zirconia, aluminum nitride, silicon nitride, silicon carbide, alumina, and mullite, or any one of organic materials such as epoxy, phenol, polyimide, or liquid crystal polymer, materials having a high insulation property are desirable. On the other hand, although silicon is suitable as a board material because its processing accuracy is easy to raise, it is preferable to add an adhesive layer in order to supply the package board with a high insulation performance. Organic monomers (epoxy, phenol, etc.), glass, or carbon materials containing inorganic fillers such as glass cloth are preferable.

BRIEF DESCRIPTION OF THE DRAWINGS

FIG. 4(A) is a perspective view of an inductor array, FIG. 4(B) is an explanatory diagram illustrating a distance between inductors and FIG. 4(C) is a sectional view illustrating the structure of the inductor;

FIG. 7(A) is a circuit diagram illustrating operational principles of a power supply module for supplying electricity to the IC chip, FIG. 7(B) is a waveform diagram of voltage/current on the input side of the power supply module; FIG. 7(C) is a waveform diagram of ON/OFF of the switch S and FIG. 7(D) is a waveform diagram of voltage/current on the output side of the power supply module;

DESCRIPTION OF THE PREFERRED EMBODIMENTS

Figure 1:
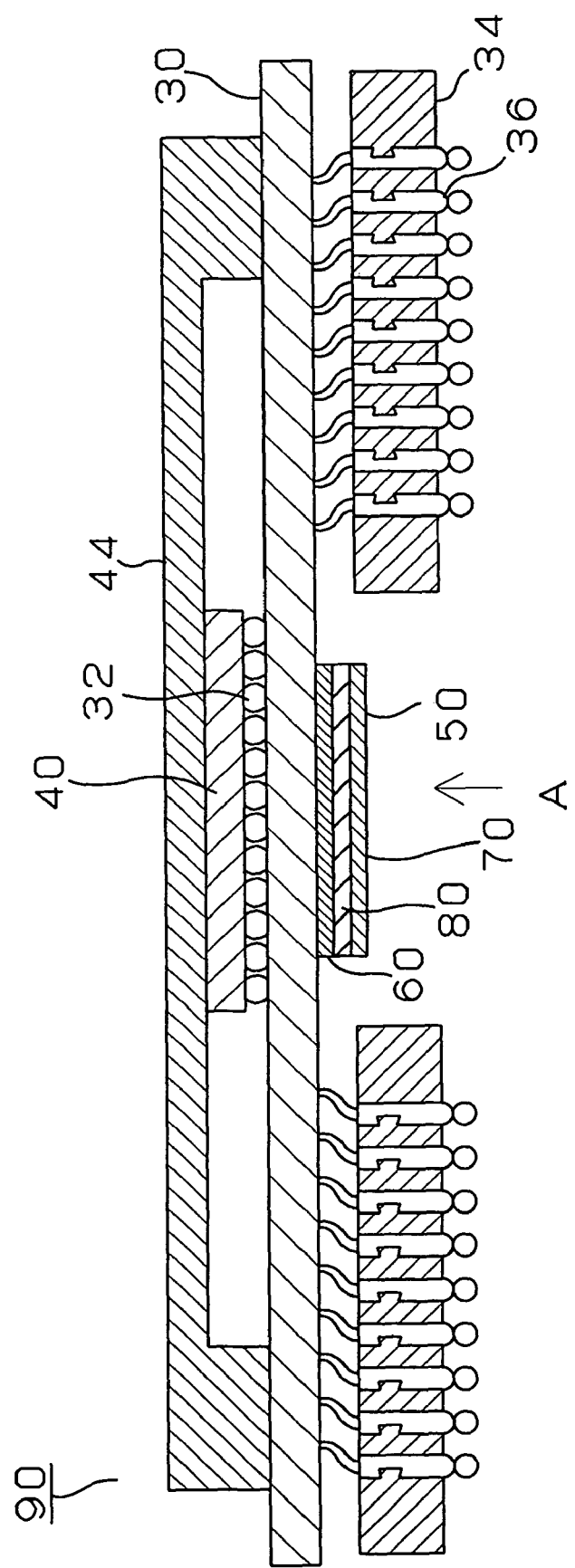
FIG. 1 is a sectional view of a package board integrated with power supply according to a first embodiment of the present invention.
Figure 2:
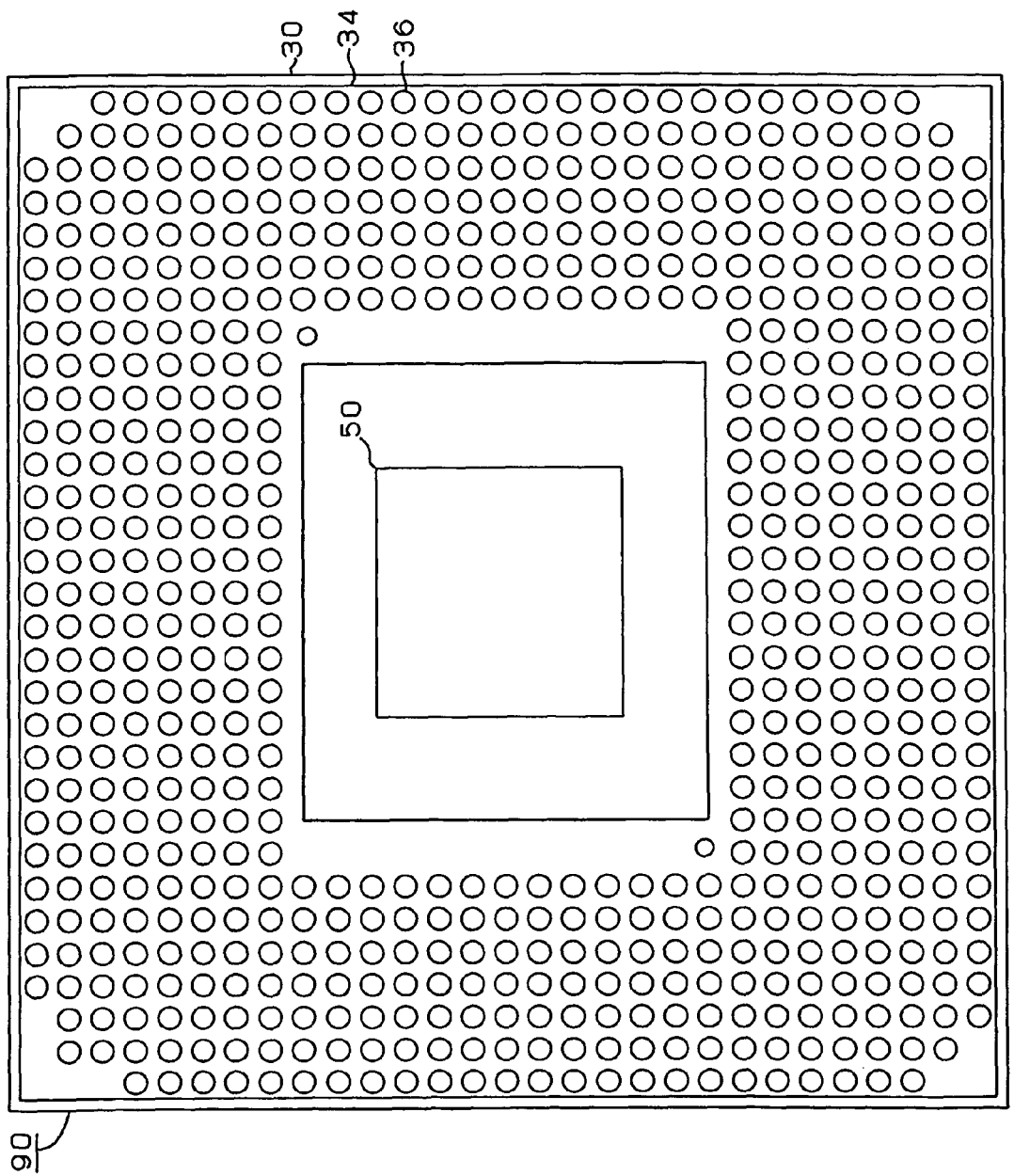
FIG. 2 is a bottom view of the package board integrated with power supply of the first embodiment.

The package board integrated with power supply according to a first embodiment of the present invention will be described with reference to FIGS. 1-7. FIG. 1 is a sectional view of the package board integrated with power supply according to the first embodiment and FIG. 2 is a view taken from an arrow A, in other words a bottom view of the package board integrated with power supply in FIG. 1.

The package board integrated with power supply 90 includes a power supply module 50 in its package board 30. An IC (load) 40 is loaded onto the package board 30 via bumps 32. A heat sink 44 for heat radiation is mounted on the top of the IC (load) 40. A pin socket 34 having pins 36 for connection to a mother board (not shown) is disposed on the outer periphery of the bottom face of the package board 30.

A power supply module 50 for supplying electricity to the IC (load) 40 is attached to the package board 30 just below the IC (load). The power supply module 50 includes three layers comprised of a power supply line distributing layer 60 for supplying power to the IC chip by dividing supply from the power supply line, an inductor layer 70 constituted of an inductor array in which smoothing filter inductors are arrayed, and a switching device layer accommodating a switching device.

FIG. 7(A) is a circuit diagram illustrating the operational principles of the power supply module (DC-DC converter) 50 for supplying power to the IC (load) 40. FIG. 7(B) is a waveform diagram of voltage V in and current I in on the input side of the power supply module 50. FIG. 7(C) is a waveform diagram of ON/OFF of the switch S. FIG. 7(D) is a waveform diagram of voltage V out and current I out on the output side of the power supply module 50. As shown in FIG. 7(B), a constant voltage V in and current I in are supplied to the input side of the power supply module 50. When the switch S is turned ON at a time of t on in a period T, as shown in FIG. 7(C), the output voltage V out is dropped, as shown in FIG. 7(C), so as to convert the output current I out to an average current I avg. The output voltage V out contains a voltage ripple V ripple. Likewise, the output current also contains a current change Δi. To adjust this output noise (voltage ripple V ripple, current change Δi) into an allowable range demanded by the IC (load) 40, the values of the inductor L and a capacitor, C which constitute a smoothing filter are set.

Figure 3:
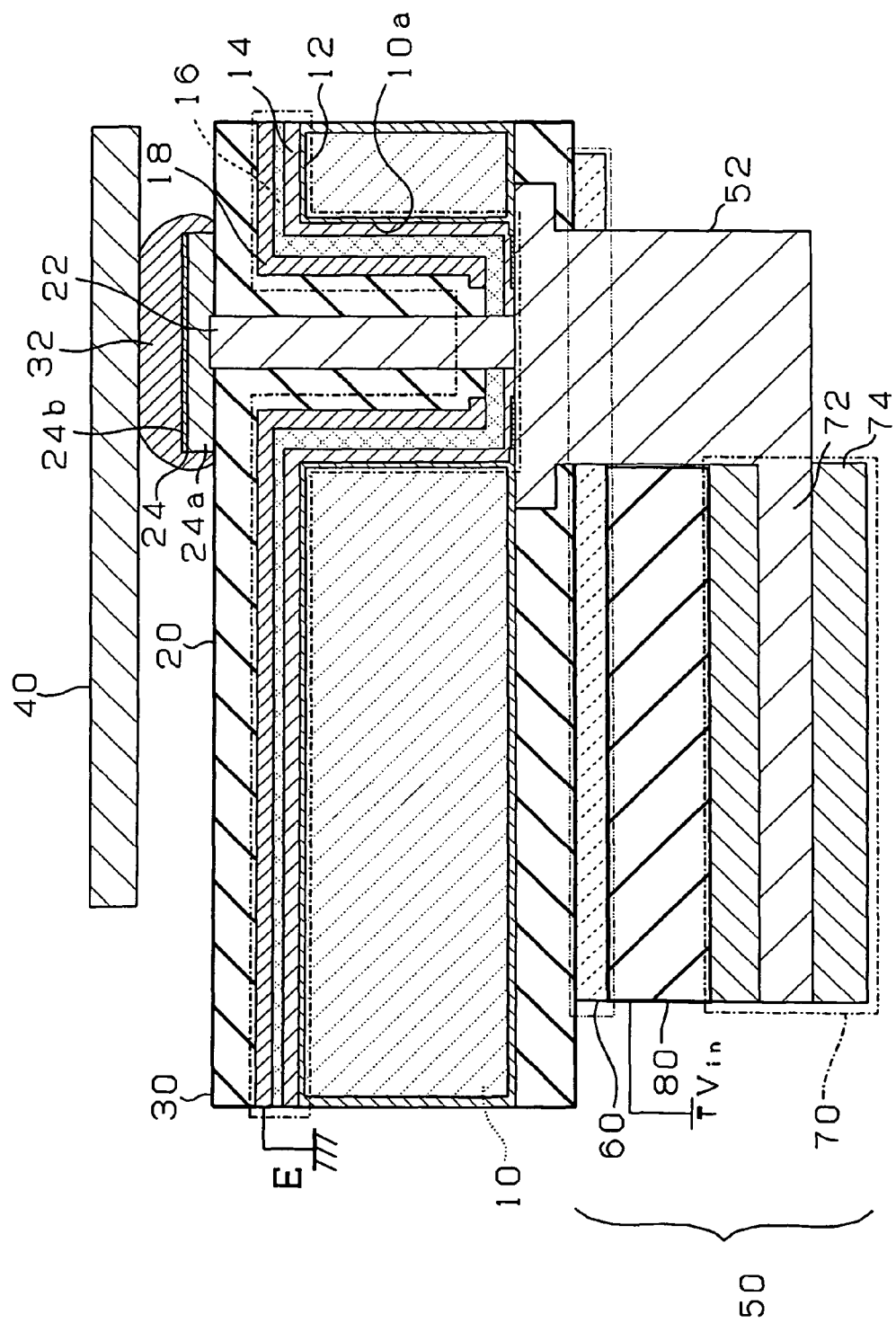
FIG. 3 is a schematic view for explaining a connection between a power supply module and an IC chip.

FIG. 3 is a schematic view for explaining a connection between a power supply module 50 and an IC chip (load) 40. The package board 30 is constituted of a silicon substrate (interposer) 10 having a thickness of 50-100 μm. The silicon substrate 10 includes a through hole 10a and is coated entirely with an insulation layer 12. A lower electrode layer 14 is provided on the inner wall of the through hole 10a, the bottom portion of the through hole and the top face of the silicon substrate 10. A dielectric layer 16 is formed on the top face of the lower electrode layer 14, and an upper electrode layer 18 is formed on the top face of the dielectric layer 16. The capacitor C described above with reference to FIG. 7(A) is constituted by sandwiching this dielectric layer 16 between the lower electrode layer 14 and the upper electrode layer 18. Although a silicon substrate is used in the first embodiment, resin substrate may likewise be used instead.

An insulation resin layer 20 is provided on the outermost layer of the silicon substrate 10 and the inner periphery of the upper electrode layer 18 of the through hole 10a. A through hole conductor 22 is formed in the center of the through hole 10a. A pad 24, which is formed by coating the surface of nickel layer 24a with an aluminum layer 24b, is provided above the through hole conductor 22 and connected to the IC (load) 40 through the bumps 32. The above-mentioned lower electrode layer 14 is connected to the through hole conductor 22. On the other hand, the upper electrode layer 18 is separated from the through hole conductor 22 by the insulation resin layer 20 and connected to a ground E.

The power supply line distributing layer 60 which constitutes the power supply module 50 includes a power supply line 52 connected to the through hole conductor 22. To connect to the power supply line 52, an inductor 74 of the inductor layer 70 is connected to the power supply module 50. The inductor 74 constitutes the inductor L described above with reference to FIG. 7(A).

The structure of the inductor array which constitutes the inductor layer 70 will be described with reference to FIG. 4. FIG. 4(A) is a perspective view of the inductor array. FIG. 4(B) is an explanatory diagram illustrating a distance between the inductors, and FIG. 4(C) is a sectional view showing the structure of the inductor.

In the inductor array 70 as shown in FIG. 4(C), an insulation layer 74A, 10 μm in thickness, is provided on the outer periphery of a copper wire 74C, 69 μm in diameter, and a magnetic layer 74B, 10 μm in thickness, is provided on the outer periphery of the insulation layer 74A. The magnetic layer 74B is composed of magnetic body (coating of a magnetic substance) composed mainly of two or more components from among iron, cobalt and nickel having a relative magnetic permeability of 600 or more, and a saturated magnetization of 1.6 T or more (preferably, 2 T or more) and formed on a conductor wire by electrolytic plating or by non-electrolytic plating (wet electric plating). Although copper wire is used in this embodiment, as the conductor wire, it is likewise permissible to use aluminum wire or silver wire instead.

Figure 11:
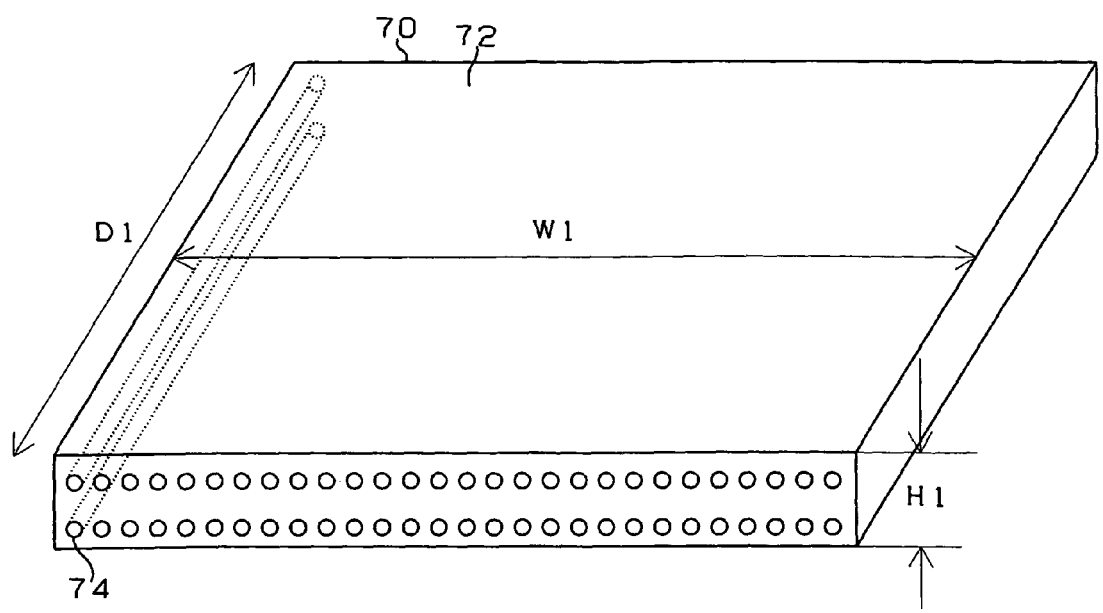
FIG. 11 is a perspective view of an inductor array according to a modification.

As shown in FIG. 4(A), the inductor array 70 is formed by arranging 30 inductors 74 of 10 mm in length in which a magnetic layer 74B is applied on the copper wire 74C in parallel, and by fixing them with the use of a resin. A magnetic material is mixed in resin. The inductor array 70 is 20 mm in width W1, 10 mm in depth D1 and 0.4 mm in thickness H1. A distance d2 between the inductors is preferably over one length and less than three lengths a diameter d1 of the inductor 74 as shown in FIG. 4(B). FIG. 11 shows an inductor array according to a modification. Although in the inductor array shown in FIG. 4(A), inductors are arranged on a single step, they may be arranged on two steps, or on three steps, as illustrated in the modification of FIG. 11. In such circumstances, the loading area can be reduced.

Figure 5:
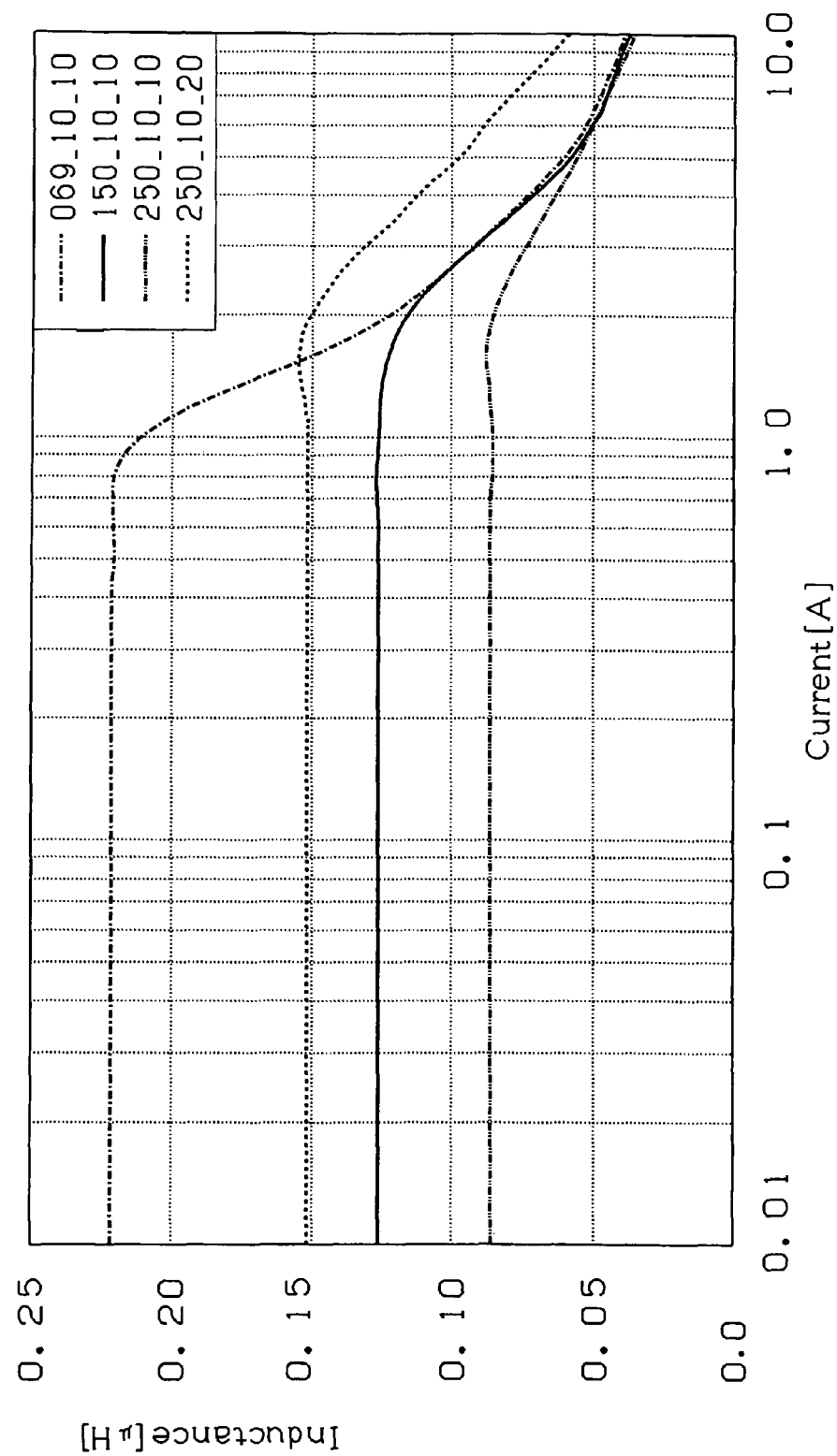
FIG. 5 is a graph showing the results of measurement of changes of inductance when the diameter of a copper wire constituting the inductor is changed from 150 μm to 250 μm, and the thickness of a magnetic layer is changed to 20 μm.

FIG. 5 represents a graph indicating results of measurement, by use of an inductor analyzer, of changes in inductance when the diameter of the copper wire 74C constituting the inductor 74 is changed between 69 μm, 150 μm, and 250 μm and when the thickness of the magnetic layer 74B is changed to 20 μm. The ordinate axis of this graph indicates inductance [μH] while the abscissa axis indicates current [A] by logarithm. In this context, the power supply frequency is set to 300 MHz, and the length of the inductor is set to 10 mm. 069 10 10 in the Figure means an inductor in which the insulation layer 74A of a thickness of 10 μm is provided on the outer periphery of the copper wire 74C, 69 μm in diameter, of the first embodiment, and the magnetic layer 74B of a thickness of 10 μm is provided on the outer periphery of the insulation layer 74A. These measurement results indicate that an inductor of 069 10 10 of 10 mm in length induces no magnetic saturation at a current of up to around three amperes (3 A) and that the drop in inductance is sufficiently small. As a result of the measurement of inductance with three inductors (069 10 10) placed at intervals of d2 (400 μm), as shown in FIG. 4(B), it was observed that the inductance characteristics were identical on the right side, at center and on the left side of the Figure. These results indicate that inductors 74 can be arranged into an inductor array.

Figure 6:
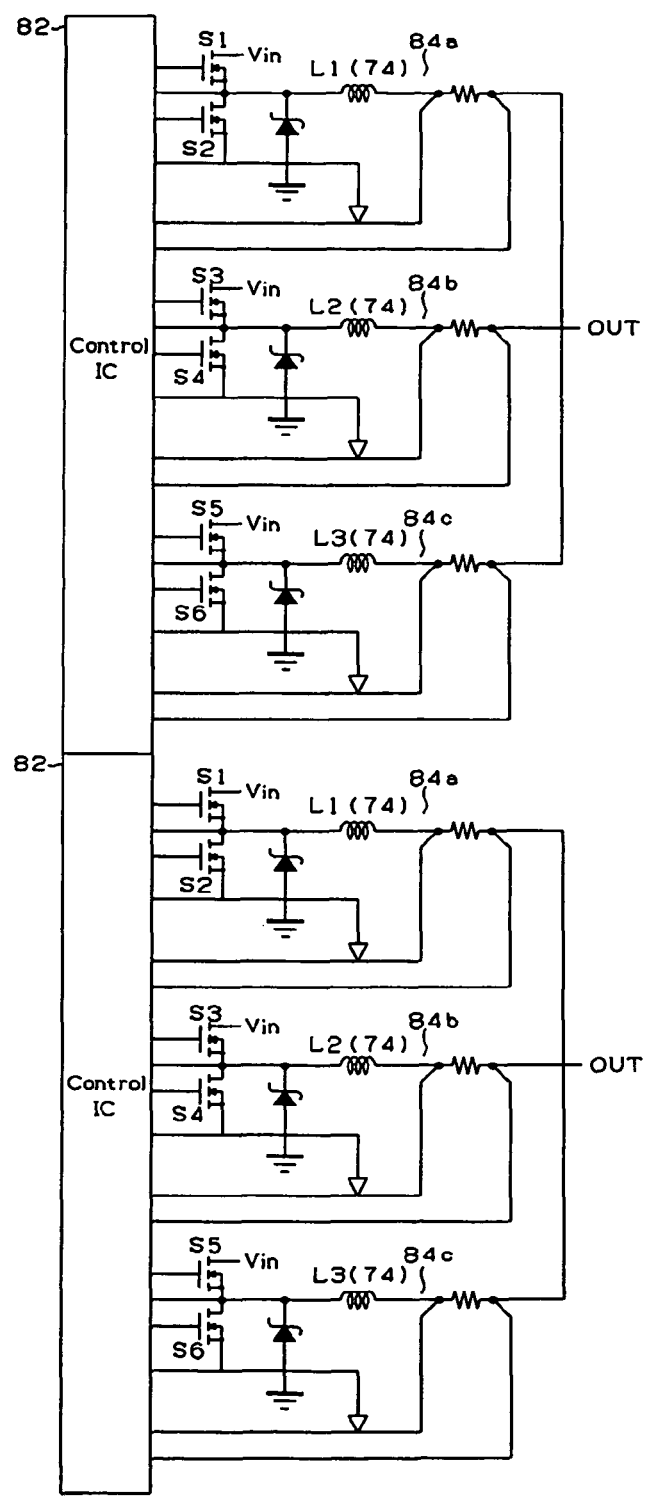
FIG. 6 is a circuit diagram illustrating the structure of a switching device provided in the switching device layer constituting a power supply module.

FIG. 6 is a circuit diagram illustrating the structure of a power supply provided in a switching device layer 80 which constitutes the power supply module in FIG. 1. Three switching circuits 84a, 84b, 84c are controlled by a single current control IC chip 82. The switching circuit 84a has switching devices S1, S2 and is connected to the inductor 74 described above with reference to FIG. 4, and to the capacitor C in which the dielectric layer 16 described above with reference to FIG. 3 is sandwiched between the lower electrode layer 14 and the upper electrode layer 18. Likewise, the switching circuit 84b has switching devices S3, S4 and is connected to the inductor 74 and the capacitor C. The switching circuit 84c has switching devices S5, S6 and is connected to the inductor 74 and the capacitor C. The current control IC chip 82 controls three switching circuits 84a, 84b, 84c by means of a time division system, in which an input voltage of 3 V is converted into a voltage of 1.1 V so as to output a current of 9 A. According to the first embodiment, a current of 90 A (about 100 W) at a voltage of 1.1 V can be supplied to the CPU (IC chip) 40 by means of 10 groups of the current control IC chip 82, and the switching circuits 84a, 84b, 84c.

With the package board integrated with power supply 90 of the first embodiment it becomes difficult to saturate the package board magnetically so that the inductor 74 can be supplied with a sufficient degree of inductance. A lot of inductors can be provided within a confined space by arranging a plurality of inductors 74 in parallel so as to form an inductor array and fixing them with resin 72, thereby making it possible to divide the power supply. In other words, the loading area can be reduced and at the same time, the loading height can be lowered. Further, the quantity of power supply lines 52 can be increased by dividing the power supply so that the level of current at an individual power supply line 52 is reduced, thereby making it possible to supply a high level of current to the IC (load) 40. Further, by incorporating the power supply module 50 into the package board 30, the distance between the power supply and the IC (load) 40 can be reduced (that is, by 50 μm corresponding to a thickness of the silicone substrate 10) so that both generation of heat and drop of voltage in the power supply line can be reduced, thereby making it possible to supply a high degree of current to the IC (load) 40.

In the package board integrated with power supply 90 of the first embodiment, the allowable current in the power supply line 52 and the through hole conductor 22 is designed to be 3 A. At this time, the IC chip needs a level of current of 90 A. Switching devices (S1-S2, S3-S4, S5-S6) and filters (inductor 74 and capacitor C) of a number obtained by dividing the level of current required by the allowable current value (3 A) of the power supply line 52. In other words, 30 pairs of them are provided. Thus, in the course of suppressing the current below the allowable current value of the power supply line a high level of current can be supplied to the IC (load) 40.

In the package board integrated with power supply 90 of the first embodiment, the capacitor C is comprised of an upper electrode layer 18 and a lower electrode layer 14 which sandwich a dielectric layer 16 provided on the side wall of the through hole 10a formed in the package board 30. Thus, because no capacitor needs to be provided on another body, both the generation of heat and the drop in voltage in the power supply line 52 can be reduced by diminishing the size of the power supply module 50 so as to supply a high level of current to the IC (load) 40.

In the package board integrated with power supply 90 of the first embodiment, the inductor array 70 is disposed just below the IC (load) 40 via the package board 30, that is, in the vicinity of the IC (load) 40. Consequently, the power supply line 52 can be reduced in length, so that both generation of heat and the drop in voltage in the power supply line can be reduced, thereby making it possible to supply a high level of current to the IC (load) 40.

According to the first embodiment, it is possible to make it difficult to saturate the inductor 74 magnetically because the magnetic layer 74B on the surface of the copper line 74C is applied by wet electric plating. Further, because the magnetic layer 74B on the surface of the copper line 74C is a magnetic body composed mainly of iron, cobalt or nickel, it is possible to make it difficult to saturate the inductor 74 magnetically. As a result, each inductor 74 that makes up the inductor array 70 can be provided with a sufficient degree of inductance.

Furthermore, because the resin 72 for molding the inductor 74 in the package board integrated with power supply 90 of the first embodiment contains a magnetic material, cross-talk between the inductors is suppressed so as to prevent overlapping of noise.

The first embodiment has been described as an example in which the package board integrated with power supply of the present invention is applied to a package board on which a load such as an MPU is mounted. Further, in comparison with conventional art in the first embodiment, the mounting area and the mounting volume of the power supply are respectively about one in six and about one in 34.

Second Embodiment

In the second embodiment, after copper wire 250 μm in diameter and coated with insulation covering of a thickness of 10 μm has been cut into pieces of 12 mm each and an insulation layer of 1 mm has been peeled off at both ends, a magnetic film of a thickness of 10 μm is deposited by electro deposition of NiFeCo. The magnetic film composed mainly of NiFeCo had a relative magnetic permeability of about 600 and a saturated magnetization of about 2 T.

After 50 conductor wires coated with magnetic film have been arranged in parallel at a pitch of 400 μm, a mixed material made up of the magnetic material and resin is charged without any gap so as to form an inductor array. The thickness of the inductor array was 450 μm. Furthermore, both ends of 1 mm each, from which the insulation layers of each conductor wire were peeled off, were taken out of the inductor array and covered with solder plating.

Figure 8:
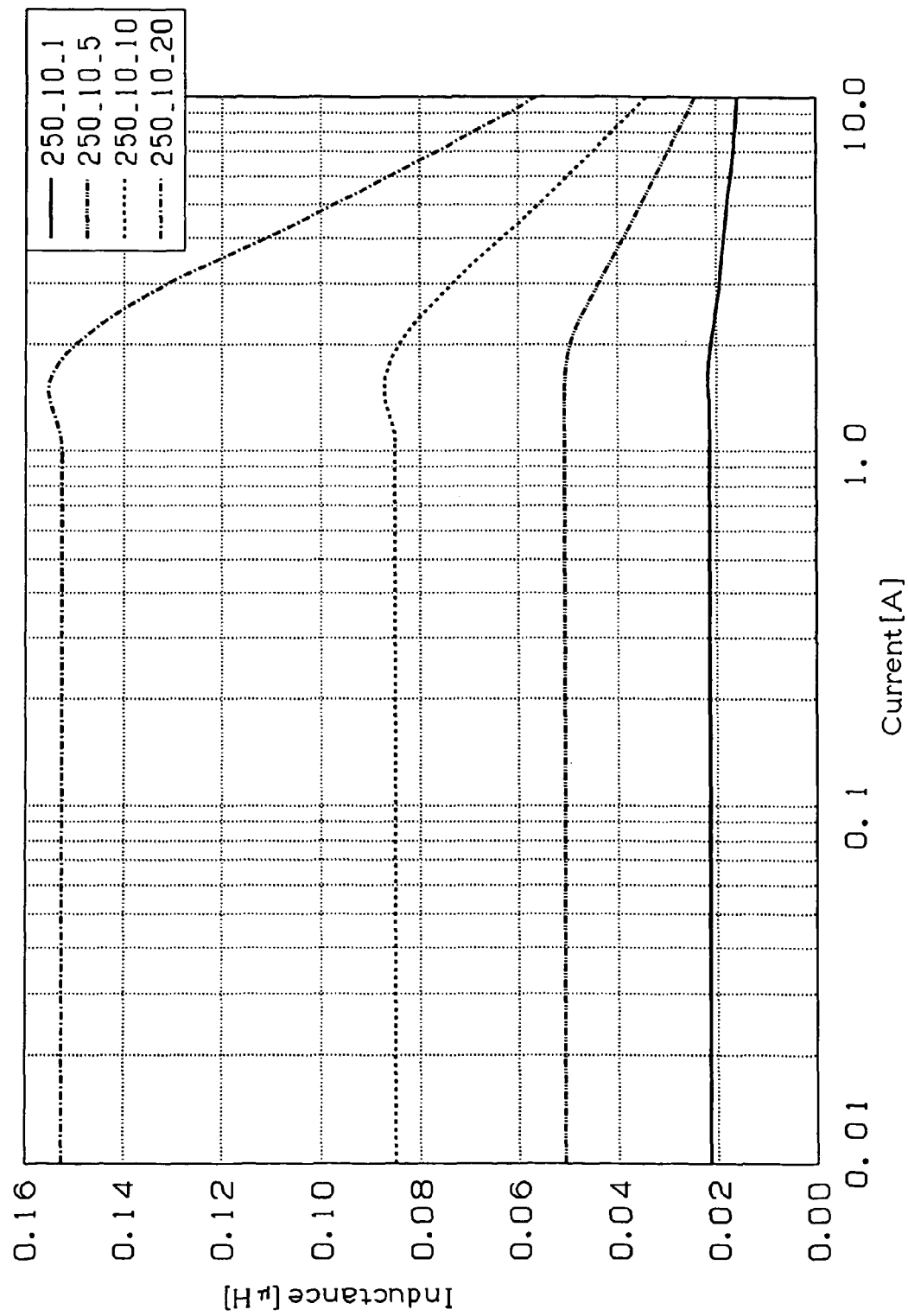
FIG. 8 is a graph illustrating the results of measurement of changes of inductance when the thickness of a magnetic layer, in the inductor of the second embodiment is changed.

In the second embodiment, inductance was measured by use of an impedance analyzer, by changing the thickness of the insulation layer. At this time, a DC overlapping characteristic was evaluated by overlapping DC currents. The results are indicated in the graph of FIG. 8. A positive correlation can be recognized between the thickness of the insulation layer and inductance. The DC overlapping characteristic was a current value (3 A), which, when for example a judgement was made with a current value in which inductance had dropped by 10%, was substantially the same regardless of the thickness of the insulation layer.

The inductor array of the second embodiment can be applied to a portion which requires a high level of current, over 50 A, for example, to the driving of a motor as well as to a power supply for a package board.

Third Embodiment

Figure 9:
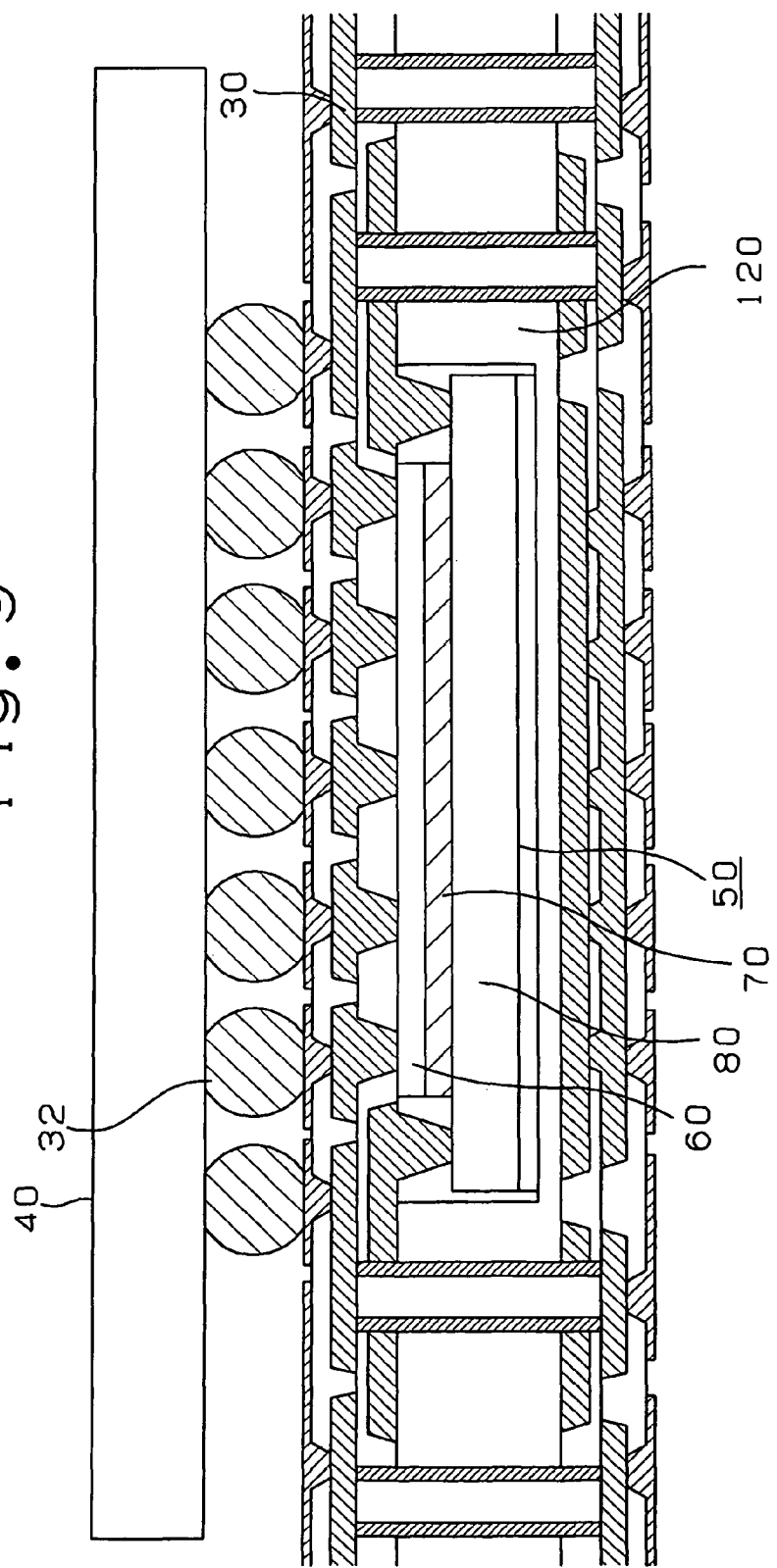
FIG. 9 is a sectional view of a package board integrated with power supply according to a third embodiment of the present invention.

The package board integrated with power supply of the third embodiment is a substrate core with a power supply incorporated in which the same inductor array 70 as in the second embodiment is mounted to overlap a power supply semiconductor within a core 120 of the package board 30 as shown in FIG. 9. The third embodiment is advantageous in that the distance between a power supply and a load is shorter than in the first embodiment.

Fourth Embodiment

In the fourth embodiment, copper wire 250 μm in diameter and coated with an insulation covering of 10 μm in thickness, was cut into pieces of 1.2 mm, a length one tenth of that in the second embodiment and as in the second embodiment a magnetic film was deposited to a thickness of 10 μm by electric deposition of NiFeCo. As in the second embodiment, the magnetic film composed mainly of NiFeCo had a relative magnetic permeability of 600 and a saturated magnetization of about 2 T.

An inductor array is formed by arranging in parallel 10 conductor wires coated with magnetic film at a pitch of 100 μm and charging those conductor wires with a mixture of magnetic material and resin without any gap. The thickness of the inductor array was about 400 μm.

Figure 10:
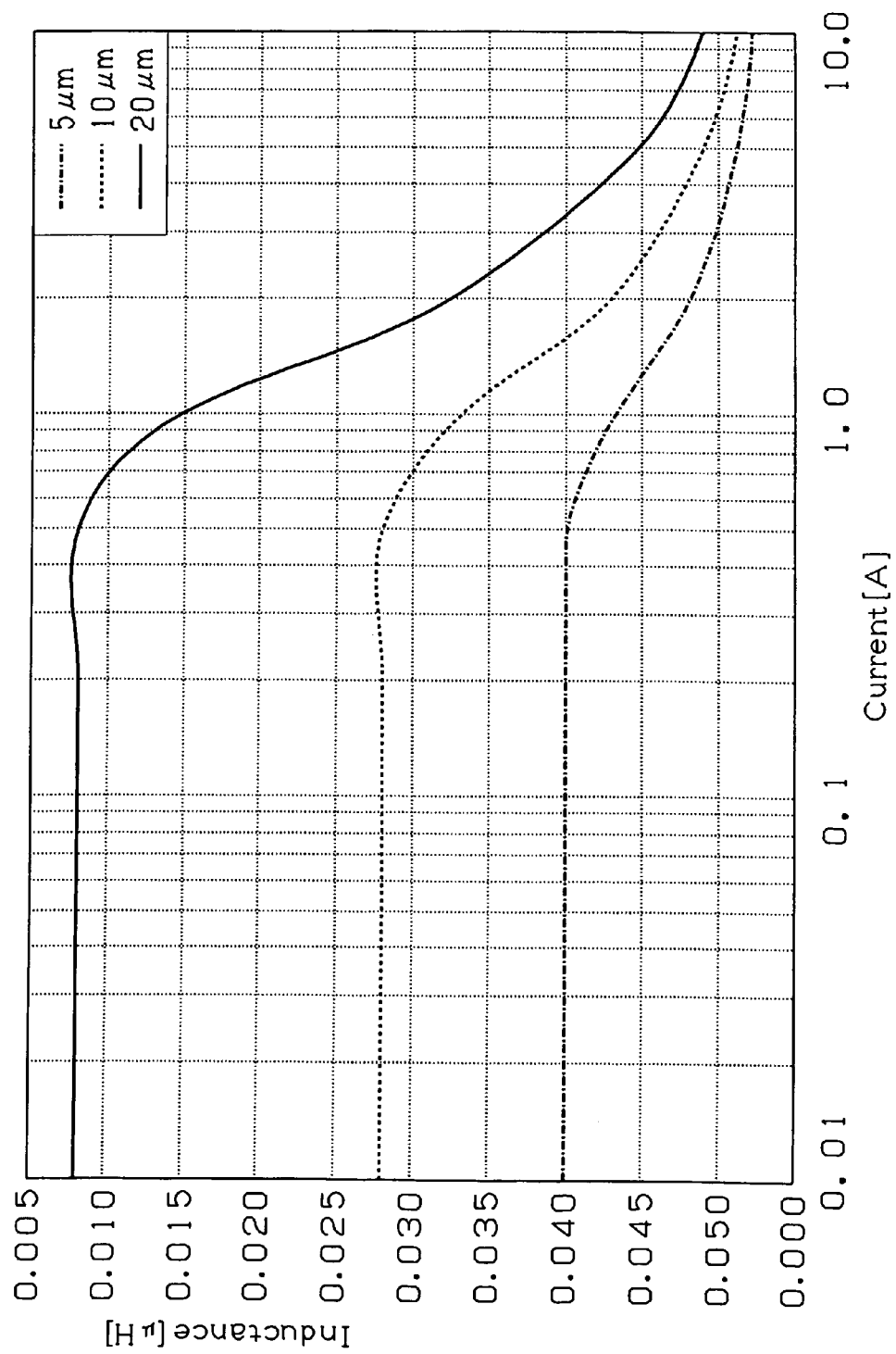
FIG. 10 is a graph representing the results of measurement of changes of inductance when the thickness of a magnetic layer according to the fourth embodiment is changed.

In the fourth embodiment, with the use of an inductance analyzer inductance was measured by changing the thickness of the insulation layer. At this time, DC overlapping characteristics were evaluated by overlapping the DC current. The results are shown in the graph of FIG. 10. A positive correlation can be recognized between the thickness of the insulation film and inductance. The DC overlapping characteristic was a current value (0.8 A) which when for example a judgement was made with a current value in which inductance had dropped by 10% was substantially the same regardless of the thickness of the insulation layer.

The inductor array of the fourth embodiment can be applied to a portion which requires a current value of 1 A or more, for example, to an integrated circuit of a portable machine, to the driving of a small precision motor, to an interface and the like.

Although the invention has been disclosed in the context of a certain preferred embodiments, it will be understood that the present invention extends beyond the specifically disclosed embodiments to other alternative embodiments of the invention. Thus, it is intended that the scope of the invention should not be limited by the disclosed embodiments but should be determined by reference to the claims that follow.

What is claimed is:

1. A package board integrated with power supply, comprising:
   a package board;
   an IC provided to the package board; and
   a power supply module which supplies electricity to the IC, the power supply module comprising a switching device, a control IC and a filter, the filter being configured to smooth an output of the switching device and comprising an inductor layer and a capacitor,
   wherein the inductor layer comprises a resin and an inductor array comprising a plurality of inductors, the inductors are arranged in parallel in the inductor layer, each of the inductors includes a conductor wire coated with a magnetic layer and fixed with the resin in a respective position, the inductor array is formed to extend along a surface of the package board, and the capacitor is formed to extend in a thickness direction of the package board.

2. The package board integrated with power supply according to claim 1, wherein the power supply module comprises the switching device and the filter in a plurality, the switching devices and filters are provided in a number obtained by dividing a level of current required by an allowable current value of a power supply line.

3. The package board integrated with power supply according to claim 1, wherein the capacitor comprises a dielectric layer and a plurality of electrode layers sandwiching the dielectric body provided in a side wall of a through hole formed in the package board.

4. The package board integrated with power supply according to claim 3, wherein the inductor array is disposed just below the IC via the package board.

5. The package board integrated with power supply according to claim 1, wherein the magnetic layer is formed by wet electric plating.

6. The package board integrated with power supply according to claim 1, wherein the magnetic layer is a magnetic body comprising at least two metals selected from the group consisting of Fe, Co and Ni.

7. The package board integrated with power supply according to claim 1, wherein the resin contains a magnetic material.

8. The package board integrated with power supply according to claim 1, wherein the power supply module is incorporated into a core substrate.

9. The package board integrated with power supply according to claim 1, wherein the inductor array is embedded in the package board.

10. A package board integrated with power supply, comprising:
    a package board;
    an IC provided to the package board; and
    a power supply module which supplies electricity to the IC, the power supply module comprising a switching device and a filter, the filter being configured to smooth an output of the switching device and comprising an inductor layer and capacitor,
    wherein the inductor layer comprises a resin and an inductor array comprising a plurality of inductors, the inductors are arranged in parallel in the inductor layer, each of the inductors includes a conductor wire coated with a magnetic layer and fixed with the resin in a respective position, the inductor array is formed to extend along a surface of the package board, and the capacitor is formed to extend in a thickness direction of the package board.

11. The package board integrated with power supply according to claim 10, wherein the power supply module comprises the switching device and the filter in a plurality, the switching devices and filters are provided in a number obtained by dividing a level of current required by an allowable current value of a power supply line.

12. The package board integrated with power supply according to claim 10, wherein the capacitor comprises a dielectric layer and a plurality of electrode layers sandwiching the dielectric body provided in a side wall of a through hole formed in the package board.

13. The package board integrated with power supply according to claim 10, wherein the inductor array is disposed just below the IC via the package board.

14. The package board integrated with power supply according to claim 10, wherein the magnetic layer is formed by wet electric plating.

15. The package board integrated with power supply according to claim 10, wherein the magnetic layer is a magnetic body comprising at least two metals selected from the group consisting of Fe, Co and Ni.

16. The package board integrated with power supply according to claim 10, wherein the resin contains a magnetic material.

17. The package board integrated with power supply according to claim 10, wherein the inductor array is embedded in the package board.

* * * * *